United States Patent [19]

Agan

[11] Patent Number: 5,796,260

[45] Date of Patent: Aug. 18, 1998

[54] PARAMETRIC TEST CIRCUIT

[75] Inventor: Tom A. Agan, Maple Grove, Minn.

[73] Assignee: Honeywell Inc., Minneapolis, Minn.

[21] Appl. No.: 614,426

[22] Filed: Mar. 12, 1996

[51] Int. Cl.$^6$ .............................. G01R 31/02; G06F 11/30
[52] U.S. Cl. ...................... 324/537; 324/522; 324/763; 326/16; 371/22.6
[58] Field of Search ........................... 324/522, 537, 324/755, 763, 605; 326/16; 371/21.4, 22.1, 22.5, 22.6

[56] References Cited

U.S. PATENT DOCUMENTS

| | | | |
|---|---|---|---|
| 5,068,547 | 11/1991 | Gascoyne | 307/443 |
| 5,117,129 | 5/1992 | Hoffman et al. | 307/443 |
| 5,528,162 | 6/1996 | Sato | 324/765 |
| 5,565,766 | 10/1996 | Kuwahara et al. | 324/763 |
| 5,633,599 | 5/1997 | Kubota | 326/16 |

*Primary Examiner*—Glenn W. Brown
*Attorney, Agent, or Firm*—Gregory A. Bruns

[57] ABSTRACT

A test circuit for input threshold voltage of an integrated circuit uses input pins and logic elements connected in a tree arrangement. The output of the tree controls programmable resistors to indicate pull-up or pull-down. The test circuit eliminates the need for a dedicated output pin for the testing formation.

6 Claims, 1 Drawing Sheet

PARAMETRIC TEST CIRCUIT

BACKGROUND OF THE INVENTION

The present invention relates to the testing of integrated circuits, and in particular to the testing of the inputs of digital logic IC's.

A semiconductor die on a wafer often includes not only the product to be manufactured, but also a number of test circuits which are fabricated on the die at the same time.

These parametric test circuits utilize the integrated circuit input and output pins on the die which are readily accessible by test equipment.

In order to verify the functionality and specification compliance of a manufactured IC, input thresholds must be measured. This is a test to verify that the inputs are working, i.e., that the input buffer is providing the proper voltage levels. In the past this has typically included the use of a test structure, called an AND tree for measuring input buffer voltage thresholds of logic states (VIH and VIL). The AND tree is a chain of two input AND gates with each AND gate's two input terminals connected respectively to the output terminal of an input buffer which has its input connected to an input pin, and the output terminal of the previous gate in the chain. The first AND gate of the AND tree has one input terminal connected to the power supply, and the other input terminal connected to the first input buffer of the AND tree. With this arrangement, the AND tree allows testing of each input by providing a combinational path around the chip to an output pin dedicated to this use. Testing is accomplished, for example, by having a high input to all input pins except the test input pin which means the output of the AND tree will be low. The voltage of the test input pin is then gradually increased and the input voltage at which the output goes high is observed. All inputs can be individually tested by applying a voltage at the input associated with each input buffer, and observing the input voltage level at which the output voltage changes at the output pin connected to the last AND gate. The AND gate arrangement just described requires a dedicated package pin to provide this information. While present day packages may include hundreds of pins, the complexity of present and future IC's often requires the use of all the pins for functionality. That is, there is no output pin available that can be used for the AND tree test function. Still, there is a need to be able to test every input pin to see that its voltage input levels meet the specifications. Thus a need exists by which AND tree testing may be implemented without using a dedicated output pin on the package.

SUMMARY OF THE INVENTION

The present invention solves this and other needs by providing a test circuit for testing input threshold voltage levels of an integrated circuit which utilizes input pins connected to logic elements in an AND tree arrangement. A last logic element is coupled to an input pin which, in the preferred form, uses programmable resistors controlled by the output of the AND tree to indicate a pull-up or a pull-down condition.

DETAILED DESCRIPTION OF THE INVENTION

Figure 1:
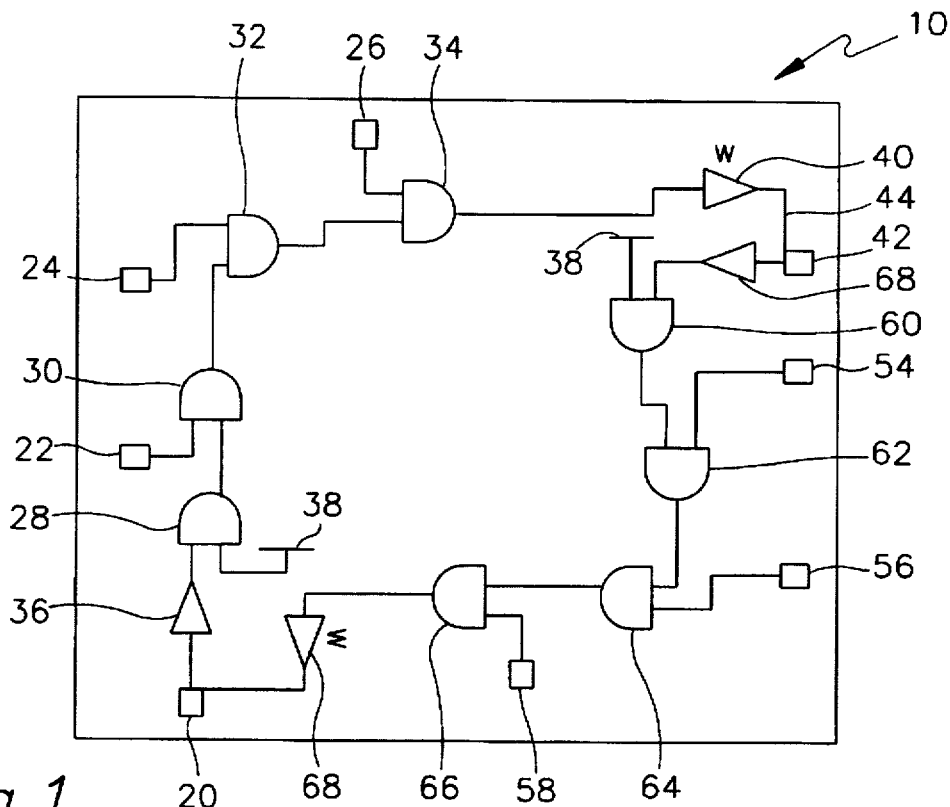
FIG. 1 is a simplified schematic of a test circuit according to the principles of the present invention.

In FIG. 1, a test circuit 10 in accordance with the principles of the present invention is shown. For simplicity, FIG. 1 shows input pins but not output pins. Also, for simplicity, buffers at input pins are not generally shown in FIG. 1. Input pins 20, 22, 24, and 26 make up a first group and are associated with AND gates 28, 30, 32, and 34 respectively. Input pin 20 is connected to the input of buffer 36 which has its output connected to one input of AND gate 28. A positive voltage 38, which is typically the power supply voltage, is connected to the other input of AND gate 28. The output of AND gate 28 is connected to one input of AND gate 30. Pin 22 is connected through a buffer (not shown) to the other input of AND gate 30. The output of AND gate 30 is connected to one input of AND gate 32. Pin 24 is connected through a buffer (not shown) to the other input of AND gate 32. The output of AND gate 32 is connected to one input of AND gate 34. Pin 26 is connected through a buffer (not shown) to the other input of AND gate 34. The output of AND gate 34 is connected to buffer 40. The output of buffer 40 is connected to input pin 42.

Input pins 42, 54, 56, and 58 make up a second group and are associated with AND gates 60, 62, 64, and 66 respectively. Input pin 42 is connected to the input of buffer 68 which has its output connected to one input of AND gate 60. A positive voltage 38, which is the power supply voltage, is connected to the other input of AND gate 60. The output of AND gate 60 is connected to one input of AND gate 62. Pin 54 is connected through a buffer (not shown) to the other input of AND gate 62. The output of AND gate 62 is connected to one input of AND gate 64. Pin 56 is connected through a buffer (not shown) to the other input of AND gate 64. The output of AND gate 64 is connected to one input of AND gate 66. Pin 58 is connected through a buffer (not shown) to the other input of AND gate 66. The output of AND gate 66 is connected to buffer 68. The output of buffer 68 is connected to input pin 20.

Figure 2:
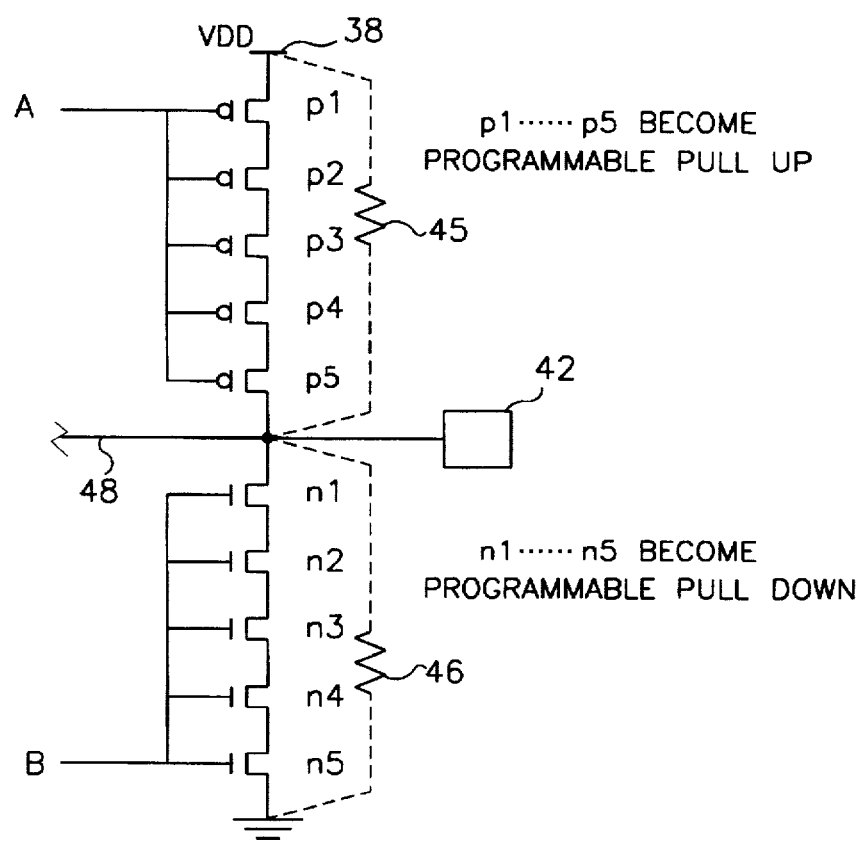
FIG. 2 is a schematic of a circuit showing additional details relative to FIG. 1.

Also connected to pin 42 as shown in FIG. 2 are electrically programmable resistors. A series of small p-channel FETs P1 through P5 are connected between pin 42 and $V_{DD}$ or power supply 38. When transistors p1–p5 have a sufficiently negative gate to source voltage applied, i.e., when transistors p1–p5 are turned on, they act as a pull-up resistor 45 between pin 42 and $V_{DD}$.

In addition, a series of small n-channel FETs, n1–n5, are connected between pin 42 and a reference voltage or ground. When transistors n1–n5 have a sufficiently positive gate to source voltage applied, i.e., when transistors n1–n5 are turned on, they act as a pull-down resistor 46 between pin 42 and ground. Conductor 48 is part of the input structure of pad 42.

Buffer 40 has the same drive strength (very weak) as pull-up resistor 45, or pull-down resistor 46.

Testing of input thresholds on input pin 22, for example, can be accomplished as follows. To test VIH, a high input is provided at input pins 20, 24, and 26 while input 22 is low, causing a low output 44 of buffer 40. In FIG. 2, output 44 of buffer 40 is connected at A and B. With output 44 low at A, transistors p1–p5 will be turned on and provide a resistance between pad 42 and $V_{DD}$, causing pad 42 to be pulled high. With output 44 low at B, transistors n1–n5 will be turned off. To continue with the testing of input pin 22, the voltage at pin 22 is gradually increased and the output at pin 42 is observed. When the input buffer connected at pin 22 provides a high enough voltage into AND gate 30, the output of AND gate 30 will go high and output 44 of buffer 40 will go high, causing transistors p1–p5 to turn off and transistors n1–n5 to turn on. With transistors n1–n5 turned on, a resistance path is provided between pad 42 and ground, causing pad 42 to be pulled to ground. The input voltage level at pin 22 is observed at the time of the change from high to low at pin 42.

To test VIL of the buffer at pad 22, a high input is applied at pad 22 and pads 20, 24, and 26. Output 44 will then be high, transistors p1–p5 will be off and transistors n1–n5 will be on, causing pad 42 to be low. The voltage level at pad 22 is then gradually reduced until the voltage level out of the buffer at pad 22 is sufficiently low that AND gate 30 will go low. This will cause output 44 to go low, turning off transistors n1–n5 and turning on transistors p1–p5, which will cause pad 42 to be pulled high. The input voltage level at pin 22 is observed at the time pad 42 is pulled high.

The principles described for testing input 22 are similarly applied to pads 20, 24 and 26. Pad 42 which has been used as an output pin cannot be tested by the arrangement previously described.

Since one input pin will be used as an output, it is necessary to have a method of testing this pin and dividing the input pins into two groups provides the method. A second group of input pins 42, 54, 56, and 58 in the preferred embodiment can be tested using the principle already described.

The present intention may be easily incorporated into the IC manufacturing process. When a designer is not able to provide a pin for the output of a parametric "AND" tree for VIL and VIH tests, then the designer may provide two input pins. Two input pins are then manufactured with programmable pull-ups and pull-downs that are programmed to be the value of the output of the "AND" ring or the complement of this value. Two input pins are used because if only one were used, the threshold of that input pin could not be tested. The second pin is used to measure thresholds for the first pin.

In the past, all designs were required to have a package output pin for ease in testing of the thresholds. The present invention does not require that an output pin be used that is not required for system simulation. Board space is critical in many applications and this allows for better utilization of the space. In the past, if the output pin was not available, lengthy and difficult test vectors were written and these often caused multiple problems when testing. That is, the test vector method has the drawback that if there are other problems, the threshold tests will not work, which masks the actual problem. Writing and performing these test vectors is quite time consuming and error prone.

Thus Applicant has provided a new parametric test circuit having many advantages. The present invention may be easily incorporated into the design of ICs. The present invention is to be limited by the appended claims rather than the foregoing description.

I claim:

1. A test circuit for testing input threshold voltage levels of an IC, comprising:

a first plurality of input pins;

a second plurality of logic elements with each one of said second plurality having a first input, a second input, and an output;

a first one of said second plurality having said first input connected to a first voltage and said second input coupled to a first one of said first plurality of input pins;

each succeeding one of said second plurality of logic elements having said first input coupled to a succeeding one of said first plurality of input pins, and said second input connected to said output of an immediately preceding one of said second plurality;

a last one of said second plurality having said output coupled to a remaining one of said first plurality of input pins; and first means responsive to a logic level signal connected at said remaining one of said first plurality of input pins.

2. Test circuit of claim 1 wherein said first means responsive to a logic level signal comprises programmable resistor means.

3. Test circuit of claim 2 further comprising:

at least one additional logic element having a first input connected to said first voltage;

a second input coupled to said remaining one of said first plurality of input pins and an output coupled to said first one of said first plurality of input pins; and second means responsive to a logic level signal connected at said first one of said first plurality of input pins.

4. Test circuit of claim 1 further comprising:

a third plurality of input pins;

a fourth plurality of logic elements with each one of said fourth plurality having a first input, a second input and an output;

a first one of said fourth plurality having said first input connected to said first voltage;

said second input of said first one of said fourth plurality coupled to said remaining one of said first plurality of input pins;

each succeeding one of said fourth plurality of logic elements having said first input coupled to one of said third plurality of input pins, and said second input coupled to said output of an immediately preceding one of said fourth plurality;

a last one of said fourth plurality having said output coupled to said first one of said first plurality of input pins; and second means responsive to a logic level signal coupled to said first one of said first plurality of input pins.

5. A method for testing input threshold levels of an integrated circuit having a plurality of input pins, comprising the following steps:

providing a plurality of logic elements with each one of said plurality having a first input, a second input and an output;

connecting said first input of a first logic element to a first voltage and connecting said second input to a first one of said plurality of input pins;

connecting said first input of each succeeding logic element to a succeeding input pin and said second input to an output of a preceding one of said plurality;

connecting said second input of each succeeding one of said plurality of logic elements to a succeeding input pin;

connecting said output of a last one of said plurality of logic elements to a remaining one of said first plurality of input pins;

varying said first voltage; and detecting a change in logic level at said remaining one pin.

6. Method of claim 5 wherein said step of detecting a change in logic level comprises the following steps:

providing a plurality of pull-up transistors and a plurality of pull-down transistors; and connecting said transistors at said remaining one pin.

* * * * *

UNITED STATES PATENT AND TRADEMARK OFFICE
CERTIFICATE OF CORRECTION

PATENT NO. : 5,796,260

DATED : August 18, 1998

INVENTOR(S) : Tom A. Agan

It is certified that error appears in the above-identified patent and that said Letters Patent is hereby corrected as shown below:

Column 1, line 3, insert the following:

--U.S. Government Rights

The Government has rights in this invention pursuant to Contract No. F29601-89-C-0084, awarded by the Department of the Air Force.--

Signed and Sealed this

Twenty-second Day of December, 1998

*Attest:*

BRUCE LEHMAN

*Attesting Officer*     Commissioner of Patents and Trademarks